United States Patent
Sepkhanov

(10) Patent No.: US 9,429,855 B2
(45) Date of Patent: Aug. 30, 2016

(54) WAVEFRONT MODIFICATION APPARATUS, LITHOGRAPHIC APPARATUS AND METHOD

(75) Inventor: Ruslan Akhmedovich Sepkhanov, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 776 days.

(21) Appl. No.: 13/495,718

(22) Filed: Jun. 13, 2012

(65) Prior Publication Data

US 2012/0320356 A1   Dec. 20, 2012

Related U.S. Application Data

(60) Provisional application No. 61/498,856, filed on Jun. 20, 2011.

(51) Int. Cl.
*G03B 27/42* (2006.01)
*G03F 7/20* (2006.01)

(52) U.S. Cl.
CPC ........... *G03F 7/706* (2013.01); *G03F 7/70308* (2013.01)

(58) Field of Classification Search
CPC ............... G03F 7/706; G03F 7/70308; G03F 7/70266; G03F 7/7085; G03F 7/70141; G03F 7/70191; G03F 7/70566; G03F 7/70758
USPC ........................................ 355/53, 63, 67, 77
See application file for complete search history.

(56) References Cited

U.S. PATENT DOCUMENTS

| | | |
|---|---|---|
| 5,805,273 A | 9/1998 | Unno |
| 7,012,265 B2 | 3/2006 | Van Der Veen |
| 7,684,008 B2 | 3/2010 | De Smit et al. |
| 7,782,440 B2 | 8/2010 | Beierl et al. |
| 8,174,674 B2 | 5/2012 | Mulkens et al. |
| 2002/0060296 A1 | 5/2002 | Van Der Veen |
| 2005/0024609 A1 | 2/2005 | De Smit et al. |
| 2009/0021707 A1 | 1/2009 | Mulkens et al. |
| 2009/0174876 A1 | 7/2009 | Schriever et al. |
| 2009/0195763 A1 | 8/2009 | Butler et al. |
| 2010/0214546 A1 | 8/2010 | Yamada et al. |
| 2010/0290020 A1 | 11/2010 | Mori |

FOREIGN PATENT DOCUMENTS

| | | |
|---|---|---|
| CN | 1637608 | 7/2005 |
| CN | 1797213 | 7/2006 |
| CN | 101566495 | 10/2009 |
| CN | 102017787 | 4/2011 |
| EP | 1 674 939 | 6/2006 |
| JP | 2009-545146 | 12/2009 |
| JP | 2010-199293 | 9/2010 |
| TW | 567400 | 12/2003 |

*Primary Examiner* — Mesfin T Asfaw
(74) *Attorney, Agent, or Firm* — Pillsbury Winthrop Shaw Pittman LLP

(57) ABSTRACT

A wavefront modification apparatus that has a plurality of acoustic emitters, the acoustic emitters configured to emit acoustic waves which travel at least partially across a radiation beam conduit. The acoustic emitters may be configured to establish a standing acoustic wave which extends at least partially across the radiation beam conduit. The wavefront modification apparatus may be provided in a lithographic apparatus, and may be used to modify the wavefront of a radiation beam which is used by the lithographic apparatus to project a pattern onto a substrate.

20 Claims, 3 Drawing Sheets

WAVEFRONT MODIFICATION APPARATUS, LITHOGRAPHIC APPARATUS AND METHOD

This application claims priority and benefit under 35 U.S.C. §119(e) to U.S. Provisional Patent Application No. 61/498,856, entitled "Wavefront Modification Apparatus, Lithographic Apparatus and Method", filed on Jun. 20, 2011. The content of that application is incorporated herein in its entirety by reference.

FIELD

The present invention relates to a lithographic apparatus, a device manufacturing method, and to a wavefront modification apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

It is desirable to project a pattern from the patterning device onto the substrate with a high accuracy. The accuracy with which the pattern is projected onto the substrate depends in part upon the optical wavefront of the radiation used to project the pattern. A deviation of the optical wavefront from its ideal shape may be characterized by one or more wavefront aberrations. A wavefront aberration can have a significant effect upon the accuracy with which a pattern is projected by the lithographic apparatus.

There are various sources of wavefront aberration in a lithographic apparatus, including for example non-ideal optical element (e.g., lens) fabrication, drift of an optical element property over time, and optical element heating. Since a wavefront aberration will often be present in a lithographic apparatus it is desirable to be able to reduce one or more wavefront aberrations in a controlled manner, thereby allowing the accuracy with which a pattern is projected by the lithographic apparatus to be increased.

SUMMARY

It is desirable to provide, for example, a novel wavefront modification apparatus which overcomes or mitigates a problem associated with the art, whether identified herein or elsewhere.

According to an aspect of the invention there is provided a wavefront modification apparatus comprising a plurality of acoustic emitters, the acoustic emitters configured to emit acoustic waves which travel at least partially across a radiation beam conduit.

The acoustic emitters may be configured to establish a standing acoustic wave which extends at least partially across the radiation beam conduit.

The acoustic emitters may be provided in pairs, acoustic emitters of each pair facing towards one another.

An acoustic emitter may face towards a reflector instead of or in addition to facing towards another acoustic emitter.

A first acoustic emitter of a pair of acoustic emitters may be configured to emit an acoustic wave having substantially the same frequency as an acoustic wave emitted by a second emitter of the pair of acoustic emitters.

The first and second acoustic emitters may emit acoustic waves having different frequencies, such that a traveling wave is established between them.

The acoustic emitters may be configured to substantially fill a cross-section of the radiation beam conduit with standing acoustic waves. The acoustic emitters may be configured to substantially fill part of a cross-section of the radiation beam conduit with standing acoustic waves.

The wavefront modification apparatus may further comprise a controller configured to control the frequency and phase of acoustic waves emitted by the acoustic emitters.

The controller may be configured to control a pair of acoustic emitters such that they both emit acoustic waves having substantially the same frequency.

The controller may be configured to switch on or switch off selected acoustic emitters in order to provide standing acoustic waves at desired locations in the radiation beam conduit.

One or more of the acoustic emitters may have an adjustable orientation. The controller may be configured to control the orientation of one or more of the acoustic emitters.

One or more of the acoustic emitters have an adjustable position. The controller may be configured to control the position of one or more of the acoustic emitters.

The plurality of acoustic emitters may be provided in substantially the same plane.

According to an aspect of the invention there is provided a lithographic apparatus comprising a support structure to support a patterning device, the patterning device serving to impart a radiation beam with a pattern in its cross-section, a substrate table to hold a substrate, a projection system to project the patterned radiation beam onto a target portion of the substrate, and a wavefront modification apparatus as described herein.

The acoustic emitters of the wavefront modification apparatus may be provided in the projection system and/or an illumination system of the lithographic apparatus, the illumination system configured to condition the beam of radiation and transport the beam toward the support structure.

The acoustic emitters may lie in a pupil plane and and/or a field plane of the lithographic apparatus.

The acoustic emitters may lie in a plane which is substantially perpendicular to an optical axis of the lithographic apparatus.

The acoustic emitters may be configured to emit acoustic waves having a frequency which corresponds with, or is a multiple of, a repetition rate of radiation pulses generated by a source of the lithographic apparatus.

The acoustic emitters may be configured to emit acoustic waves having a frequency which is related to or determined by a repetition rate of radiation pulses generated by a source of, or associated with, the lithographic apparatus. For example, a frequency may be selected which provides anti-nodes of an acoustic wave at different desired locations for different radiation pulses.

The controller may be configured to receive measurements or predictions of a wavefront aberration of the radiation beam, and to determine a standing acoustic wave configuration which will reduce or eliminate the wavefront aberration of the radiation beam.

The acoustic emitters may be configured to establish the standing acoustic wave in a gas.

According to an aspect of the invention there is provided a device manufacturing method comprising using a patterning device to provide a radiation beam with a pattern in its cross-section; using a projection system to project the patterned radiation beam onto a target portion of a substrate; and using acoustic emitters to emit acoustic waves to establish an acoustic wave which travels at least partially across a radiation beam conduit through which the radiation beam, patterned or not, passes prior to being incident upon the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
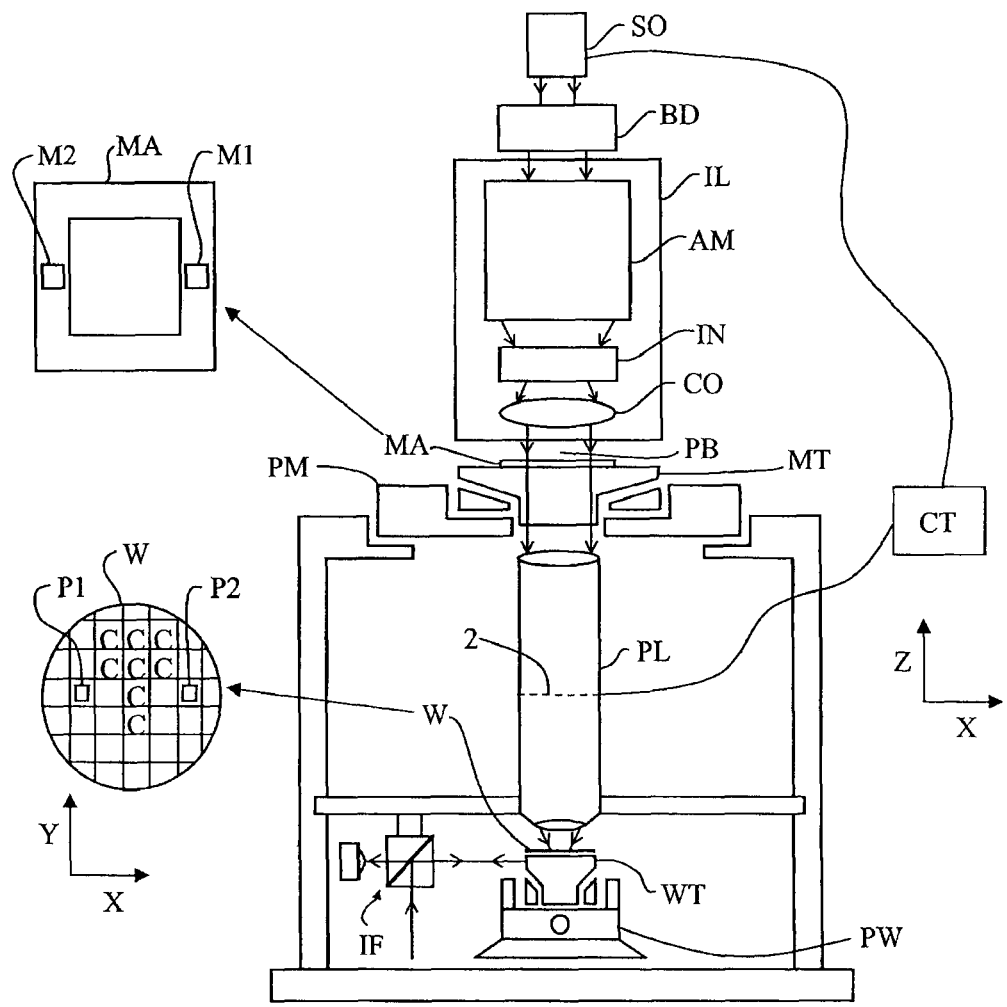
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157, 126 nm or some other wavelength).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or DUV radiation).

a support structure (e.g. a mask table) MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above or a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table MT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL is schematically represented in FIG. 1 by a generally cylindrical shape (although it may have another shape). The projection system PL may comprise a plurality of optical elements (e.g., lenses) arranged in series (e.g. arranged in a column). The optical elements may be formed from, for example, quartz. The optical elements may comprise entirely lenses or other transmissive optical elements, comprise entirely mirrors or other reflective optical elements or comprise a combination of transmissive and reflective optical elements. The optical elements may be held, for example, in a housing. The housing may be formed, for example, from aluminum.

The radiation beam PB passes through the projection system PL and is imaged onto the substrate W. The projection system PL may be considered to be an example of a radiation beam conduit, since the radiation beam passes through the projection system during operation of the lithographic apparatus. Other parts of the lithographic apparatus, such as the illumination system IL, may also be considered to be a radiation beam conduit.

In an embodiment, a wavefront modification apparatus 2 (indicated schematically by a dotted line) is provided in the projection system PL. The wavefront modification apparatus 2 is connected to a controller CT which may control operation of the wavefront modification apparatus. The controller CT is also connected to the source SO. This allows the controller CT to synchronize operation of the wavefront modification apparatus 2 with operation of the source SO.

Figure 2:
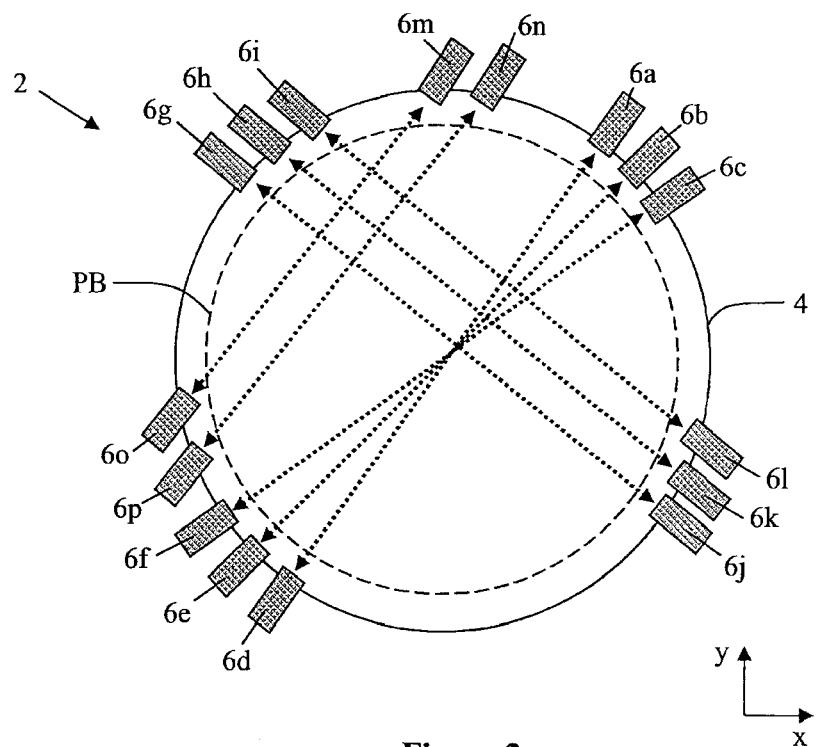
FIG. 2 schematically depicts a wavefront modification apparatus according to an embodiment of the invention.

A wavefront modification apparatus 2 according to an embodiment is illustrated schematically viewed from above in FIG. 2. The wavefront modification apparatus 2 comprises a plurality of acoustic emitters 6a-p. The acoustic emitters 6a-p are mounted on a frame 4 which extends around an outer perimeter of the radiation beam PB. Each acoustic emitter 6a-p is configured to emit an acoustic wave towards an associated emitter. For example, acoustic emitter 6a is configured to emit an acoustic wave towards acoustic emitter 6*d*, and acoustic emitter 6*d* is configured to emit an acoustic wave towards acoustic emitter 6*a*. These acoustic emitters 6*a,d* may be considered to be a pair of acoustic emitters which face towards one another. The acoustic waves emitted by the acoustic emitters 6*a,d* have the same frequency (or substantially the same frequency). The acoustic waves interfere with one another, thereby leading to the generation of a standing acoustic wave. The positions of nodes and anti-notes of the standing acoustic wave depend upon the relative phases of the acoustic waves emitted by the pair of acoustic emitters 6*a,d*. The positions of the nodes and anti-notes may thus be adjusted by modifying the relative phases of the acoustic waves. The frequency and phase of the acoustic waves emitted by the pair of acoustic emitters 6*a,d* may be controlled by a controller CT (see FIG. 1).

The standing acoustic wave generated by the acoustic emitters 6*a,d* provides a pressure profile which extends across part of the radiation beam PB. The refractive index of gas (e.g. air) in the projection system PL is a function of gas pressure. Thus, the pressure profile gives rise to a refractive index profile in the gas. Maxima and minima of the refractive index profile occur at anti-nodes of the standing acoustic wave. The refractive index is substantially unchanged at nodes of the standing acoustic wave. The refractive index profile generated by the standing acoustic wave causes a modification of the radiation beam PB.

The effect applied by the standing acoustic wave to a given part of the radiation beam PB will depend upon the phase of the standing acoustic wave when that part of the radiation beam passes through it. For example, if the part of the radiation beam passes through an anti-node of the standing acoustic wave when the anti-node is at a maximum, then the part of the radiation beam will experience a high-pressure and thus a high refractive index. The optical path length traveled by the part of the radiation beam will therefore be increased (relative to the optical path length traveled by part of the radiation beam which passes through a node). Conversely, if the part of the radiation beam passes through an anti-node of the standing acoustic wave when the anti-node is at a minimum then the part of the radiation beam will experience a low pressure and thus a low refractive index. The optical path length traveled by the part of the radiation beam will therefore be reduced (relative to the optical path length traveled by part of the radiation beam which passes through a node). The same situation applies to a part of the radiation beam which passes partway between an anti-node and a node of the standing acoustic wave, although the amplitude of the effect applied by the acoustic wave will be smaller.

The accuracy with which a pattern is projected from the patterning device MA onto a substrate W by the lithographic apparatus (see FIG. 1) depends in part upon the optical wavefront of the radiation beam PB which is used to project the pattern. A deviation of the optical wavefront of the radiation beam PB from its ideal shape may have a significant detrimental effect upon the accuracy with which the pattern is projected by the lithographic apparatus. The wavefront modification apparatus 2 may be used to modify the optical wavefront of the radiation beam PB, and thereby reduce or eliminate a deviation of the optical wavefront of the radiation beam from its ideal shape. This may facilitate an improvement of the accuracy with which the pattern may be projected onto a substrate W by the lithographic apparatus.

Each standing acoustic wave generated by a pair of acoustic emitters 6*a-p* will have a finite diameter, which may for example be determined by the size and/or configuration of the acoustic emitters used to emit the acoustic waves. It may be desirable to provide acoustic waves across a substantial portion of, or even all of, a cross-section of the radiation beam PB. Equivalently, it may be desirable to provide acoustic waves across a substantial portion of, or even all of, a cross-section of a radiation beam conduit (e.g. part of the projection system PL and/or the illumination system IL through which the radiation beam PB passes). This may be achieved by providing a plurality of acoustic emitters around an outer portion of the radiation beam conduit (e.g. around the frame 4).

In an embodiment, acoustic emitters may be distributed around an outer portion of the radiation beam conduit (e.g. provided on the frame 4). The acoustic emitters may be positioned, for example, with substantially equal separations between them or with different separations between them. The acoustic emitters may be configured to direct the acoustic waves such that they all pass through a central point (for example as represented schematically in part by acoustic emitters 6*a-f*). For example, the central point may correspond with the optical axis of the lithographic apparatus. Alternatively, some or all of the acoustic emitters may be configured to direct the acoustic waves such that they do not entirely or at all pass through a central point (for example as represented schematically by acoustic emitters 6*g-p*). The acoustic emitters may be configured to direct the acoustic waves such that they establish a grid which fills (or fills a substantial portion of) a cross-section of the radiation beam conduit. The generation of part of such a grid by acoustic emitters 6*g-p* is illustrated schematically in FIG. 2. Acoustic emitters may be configured to direct the acoustic waves in any desired directions. Acoustic emitters may be configured to substantially fill a cross-section of the radiation beam conduit with standing acoustic waves. Any suitable number of acoustic emitters may be provided.

Each acoustic emitter may be one of a pair of acoustic emitters. Each acoustic emitter of the pair is configured to direct an acoustic wave at an opposite acoustic emitter of the pair. The acoustic waves emitted by each acoustic emitter of the pair have substantially the same frequency (include a plurality of substantially same frequencies). It is this emission of acoustic waves traveling in opposite directions with the substantially same frequency which leads to the generation of standing acoustic waves. Different pairs of acoustic emitters may emit acoustic waves with different frequencies.

Figure 3:
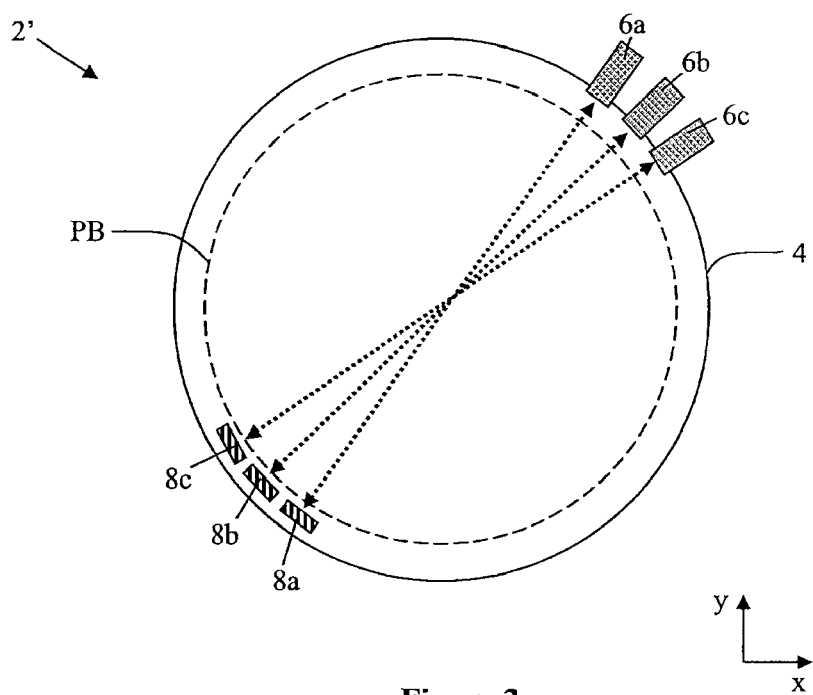
FIG. 3 schematically depicts a wavefront modification apparatus according to a further embodiment of the invention.

In an embodiment, as shown in FIG. 3, a wavefront modification apparatus 2' may comprise a series of single acoustic emitters 6*a-c* instead or in addition to pairs of acoustic emitters. A surface which is capable of reflecting an acoustic wave may be provided opposite each acoustic emitter 6*a-c*. The reflective surface 8*a-c* may be, for example, a substantially flat surface which is substantially perpendicular to the direction of propagation of the acoustic wave emitted by the single acoustic emitter. Where a single acoustic emitter is used, the wavefront modification apparatus will behave in generally the same way as the wavefront modification apparatus described above. However, where a single acoustic emitter is used in combination with only a reflective surface, the positions of nodes and anti-nodes of the standing acoustic wave cannot be controlled by controlling the phase between acoustic emitters since only a single acoustic emitter is provided in such a combination. Although three acoustic emitters 6*a-c* and three reflective surfaces 8*a-c* are shown in FIG. 3, any suitable number of acoustic emitters and reflective surfaces may be provided.

The controller CT may be configured to switch on or switch off selected acoustic emitters in order to provide standing acoustic waves at desired locations in the radiation beam conduit.

In an embodiment, one or more of the acoustic emitters 6a-p may have an adjustable orientation. For example, an acoustic emitter may be held on a rotationally adjustable mounting (not illustrated). The rotationally adjustable mounting may allow, for example, the orientation of the acoustic emitter to be modified around one or more rotational axes. The orientation of the acoustic emitter may be, for example, controlled by the controller CT (see FIG. 1). The orientation of an acoustic emitter may be controlled by the controller CT in order to direct acoustic waves across a portion of the radiation beam conduit where it is desired to generate standing acoustic waves.

In an embodiment, one or more of the acoustic emitters 6a-p may have an adjustable position. For example, the acoustic emitter may be held on a mounting which allows the position of the acoustic emitter to be adjusted. The adjustable mounting may for example allow the position of the acoustic emitter to be changed in one or more directions. The position of the acoustic emitter may be, for example, controlled by a controller CT (see FIG. 1). The position of an acoustic emitter may be controlled by the controller CT in order to direct acoustic waves across a portion of the radiation beam conduit where it is desired to generate standing acoustic waves.

Although the acoustic emitters 6a-p are shown in FIG. 2 as being mounted on a frame 4, the acoustic emitters may be secured in any suitable manner (the frame 4 is not essential). For example, the acoustic emitters may be mounted on a wall of the projection system PL (or may be mounted on a wall of the illumination system IL).

In an embodiment, it may be desirable to provide a wavefront modification at particular location in the beam conduit (e.g. in order to adjust the wavefront at a particular location in the radiation beam). This may be, for example, achieved by operating only those acoustic emitters which generate acoustic waves that pass through that location, and by selecting relative phases of the acoustic emitters such that an anti-node of the standing acoustic wave is provided at that location.

Although the standing acoustic wave is substantially stationary in space, the pressure profile caused by the standing acoustic wave varies with time. In particular, the pressure at an anti-node of the standing acoustic wave will vary from a maximum to a minimum with a period determined by the frequency of the standing acoustic wave. Since the speed of light is much faster than the speed of sound, the pressure profile experienced by a radiation pulse of the radiation beam does not change significantly while the radiation pulse passes through the standing acoustic wave. However, in order to help ensure that successive radiation pulses of the radiation beam experience the substantially same pressure profile, the standing acoustic wave and the radiation pulses may be synchronized.

Synchronization of the standing acoustic wave to the radiation pulses of the radiation beam may restrict the maximum wavelength of the standing acoustic wave. For example, if the lithographic apparatus were to have a radiation beam pulse repetition rate of 2 kHz, then the minimum frequency that the standing acoustic wave may have while providing synchronization with the radiation pulses is also 2 kHz. The wavelength of the acoustic wave is equal to the speed of sound divided by the frequency of the acoustic wave. In this case the maximum wavelength of an acoustic wave that can provide synchronization with the radiation pulses is 350 ms$^{-1}$/2 kHz=~17 cm. In a typical lithographic apparatus the radiation beam (or equivalently the radiation conduit) may have a diameter of around 10 cm. Thus, the maximum wavelength of the acoustic wave is significantly greater than the diameter of the radiation beam, and as a result the standing acoustic wave is capable of providing wavefront modification for low order aberrations in the radiation beam.

The standing acoustic wave does not need to have the same frequency as the radiation pulse repetition rate, but may instead for example have a frequency which is a multiple of the radiation pulse repetition rate. Where this is the case successive radiation pulses will not encounter successive maxima of the standing acoustic wave, but will instead encounter every second, third or nth maxima of the standing acoustic wave. This still helps to ensure that successive radiation pulses experience the substantially same pressure profile, while allowing standing acoustic waves with shorter wavelengths to be used. The shorter wavelength standing acoustic waves will provide pressure profiles having more maxima (the number of maxima being determined by the wavelength of the standing acoustic wave).

In an embodiment, the standing acoustic wave may have a frequency which is not equal to or a multiple of the radiation pulse repetition rate. Where this is the case, successive radiation pulses may experience anti-nodes of the standing acoustic wave which have different amplitudes. In this way a time-varying wavefront modification may be applied to the radiation beam. The time-variation of the wavefront modification may be determined by a frequency mismatch between the frequency of the acoustic wave and the frequency of the radiation pulses.

The separation distance between high-pressure anti-nodes of the standing acoustic wave may be selected via selection of an appropriate wavelength of the acoustic waves emitted by the acoustic emitters used to generate the standing acoustic wave. The positions of the high-pressure anti-nodes of a given standing acoustic wave may be selected via adjustment of the relative phase between the acoustic emitters used to generate the standing acoustic wave.

Modification of the radiation beam wavefront to compensate for particular aberrations may be achieved through selection of appropriate wavelengths (or frequencies) and phases of acoustic waves emitted by appropriately positioned and oriented acoustic emitters.

In an embodiment, it may be desired to reduce the wavelength of the standing acoustic wave (and correspondingly increase its frequency), while maintaining a one-to-one correspondence between radiation pulses and acoustic wave maxima. Where this is the case, the repetition rate of the radiation pulses may be increased in order to allow the wavelength of the standing acoustic wave to be decreased. In practice, the repetition rate of the radiation pulses may be fixed or may depend upon parameters of the lithographic apparatus which cannot be easily modified. For this reason, it may be more straightforward to increase the frequency of the standing acoustic wave to a multiple of the pulse repetition rate than to increase the pulse repetition rate.

The acoustic emitters of the wavefront modification apparatus may be located in a pupil plane of the projection system PL (or in a pupil plane in some other suitable part of the lithographic apparatus). Where this is the case, the wavefront modification apparatus will apply modifications to the radiation beam in the pupil plane, and will therefore introduce pupil effects. The wavefront modification apparatus may be used to apply, for example, an aberration offset. The term "aberration offset" is intended to mean an aberration modification which will be applied equally throughout an image in a field plane. The wavefront modification may thus be used to reduce or correct an aberration in the radiation beam across the entire wavefront of the radiation beam. For example, if a defocus is introduced in the pupil plane by the wavefront modification apparatus, then all points of the image will be substantially equally defocused because the radiation from each point of the image passes through the same pupil plane. The wavefront modification apparatus may modify the wavefront of the radiation beam in the pupil plane without introducing field plane modifications into the radiation beam. The wavefront modification apparatus may be used to reduce or eliminate an unwanted aberration offset which is introduced into the radiation beam by the projection system PL (or by other parts of the lithographic apparatus).

The acoustic emitters of the wavefront modification apparatus may be located in a field plane of the projection system PL (or in a field plane in some other part of the lithographic apparatus). Where this is the case, the wavefront modification apparatus will apply modifications to the radiation beam in the field plane, and will therefore introduce field effects into the radiation beam. The wavefront modification apparatus may be used to reduce or correct an aberration which exists at a particular spatial location in the radiation beam. Reduction or correction of an aberration which exists at a particular spatial location in the radiation beam may not be possible using a wire grid based apparatus (as described further below), because wires of the wire grid will be imaged onto the substrate during operation of the lithographic apparatus.

As explained above, locating the wavefront modification apparatus in a pupil plane allows the same aberration modification to be applied across the entire radiation beam, whereas locating the wavefront modification apparatus in a field plane allows aberration modifications to be applied at particular spatial locations in the radiation beam. Two wavefront modification apparatus may be provided, a first being in a pupil plane and a second being in a field plane. These may allow aberration modification to be performed across the entire radiation beam and allow aberration modification to be performed at particular spatial locations in the radiation beam.

The acoustic emitters of the wavefront modification apparatus may be located between a field plane and a pupil plane of the projection system PL (or in some other part of, the lithographic apparatus). Where this is the case, the wavefront modification apparatus will provide a mixed pupil-field modification of the radiation beam.

The acoustic emitters of the wavefront modification apparatus may be provided in a plane which is substantially perpendicular to an optical axis of the lithographic apparatus. Where this is the case, the wavefront modification apparatus shown in FIG. 2 will provide a two-dimensional modification of the radiation beam wavefront.

Figure 4:
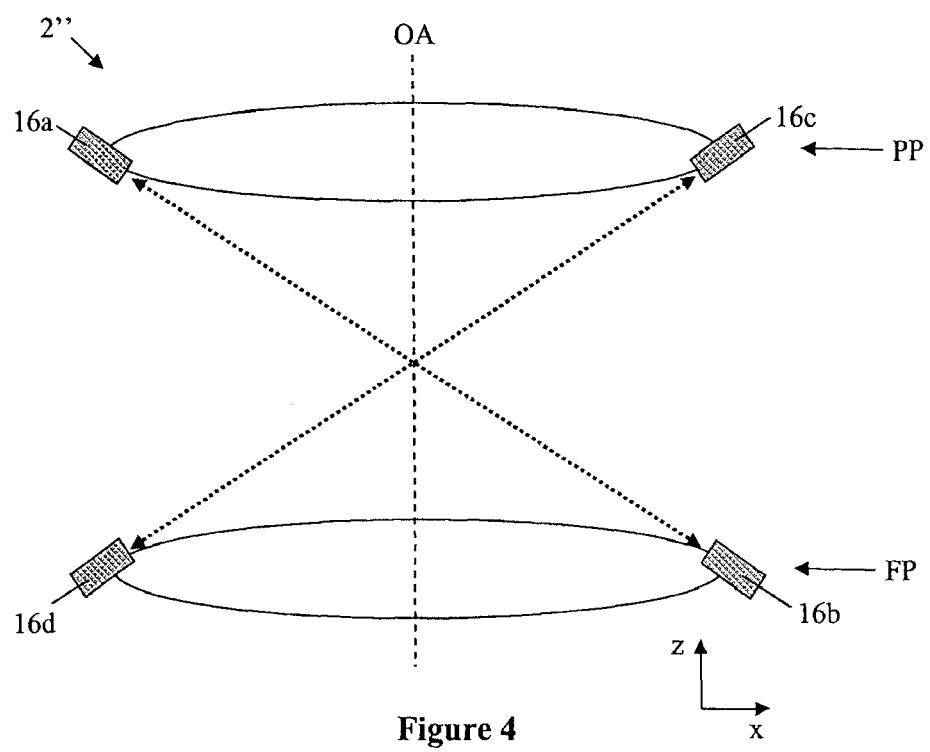
FIG. 4 schematically depicts a wavefront modification apparatus according to a further embodiment of the invention.

As shown schematically in FIG. 4, the wavefront modification apparatus 2" may be configured to provide a three-dimensional modification of the radiation beam wavefront. As may be seen in FIG. 4, acoustic emitters 16a-d of the wavefront modification apparatus are not configured to emit acoustic waves perpendicular to the optical axis OA of the radiation beam, but are instead configured to emit acoustic waves such that they intersect with the optical axis in a non-perpendicular direction. In FIG. 4, four acoustic emitters 16a-d are illustrated, although it will be appreciated that any suitable number of acoustic emitters may be provided. Two of the acoustic emitters 16a,c are provided in or at a pupil plane PP of the lithographic apparatus, and two of the acoustic emitters 16b,d are provided in or at a field plane FP of the lithographic apparatus. Standing acoustic waves generated by the wavefront modification apparatus 2" extend between the pupil plane and the field plane, and therefore apply mixed pupil-field wavefront modifications to the radiation beam.

The wavefront modification apparatus 2" shown in FIG. 4 may be provided, for example, in the projection system of the lithographic apparatus, in the illumination system of the lithographic apparatus, and/or in any other suitable location in the lithographic apparatus. Although the wavefront modification apparatus 2" of FIG. 4 comprises acoustic emitters 16a,c in or at a pupil plane PP and acoustic emitters 16b,d in or at a field plane FP, the acoustic emitters may be provided additionally or alternatively in any other suitable plane.

More than one wavefront modification apparatus may be provided in a single lithographic apparatus.

The wavefront modification apparatus may provide one or more advantages over other wavefront modification apparatus. One other wavefront modification apparatus comprises actuators located around the periphery of a lens in the projection system, the actuators being used to modify the shape and/or position of the lens and thereby apply a wavefront modification. A disadvantage of these actuators is that the speed with which they may modify the shape of the lens is relatively low. A further disadvantage is that the actuators maybe capable of applying only a limited range of modification to the lens shape, and may thus be capable of applying a limited range of wavefront modification to the radiation beam.

An embodiment of the invention may be capable of applying wavefront modification to the radiation beam with a speed that is greater than that achievable by the actuators. A standing acoustic wave is established once acoustic waves emitted by a pair of acoustic emitters have traveled across the space between them. The separation between a pair of acoustic emitters (for example acoustic emitters 6a,b in FIG. 2) may be, for example, around 10 cm (this may be the width of the radiation beam, or the width of the radiation conduit). Assuming that the acoustic waves emitted by the acoustic emitters travel at the speed of sound, i.e. 350 m/s, acoustic waves emitted by the acoustic emitters may travel across the radiation conduit in around 0.3 ms. Thus, a desired standing acoustic wave may be established in the radiation conduit in around 0.3 ms. If the radiation conduit were to have a greater width then it would take longer to establish the standing acoustic wave, since the acoustic waves would need to travel further in order to travel across the radiation conduit. Similarly, if the radiation conduit were to have a smaller width then it would take less time to establish the standing acoustic wave.

In addition or alternatively, the wavefront modification apparatus may be capable of quickly modifying a standing acoustic wave. The speed at which a standing acoustic wave may be modified is the same as the speed at which a standing acoustic wave may be established (it depends upon the speed of sound and the distance to traveled by the acoustic wave). The modification of the standing acoustic wave may for example comprise an adjustment of the position of nodes and anti-nodes of the standing acoustic wave, the adjustment being performed by modifying the relative phases of acoustic emitters being used to generate the standing acoustic wave.

A further advantage is that an embodiment of the invention may be capable of applying a wider range of modifications to the radiation beam than may be applied by the actuators. For example, an embodiment of the invention may be capable of applying a modification to the radiation beam with a higher spatial resolution than may be applied using actuators. For example, an embodiment of the invention may be capable of reducing or eliminating an aberration offset (when the apparatus is located in or at the pupil plane) in the radiation beam which has a higher spatial frequency than the highest spatial frequency that may be applied using actuators. An embodiment of the invention may be capable of reducing or eliminating field aberration effects (when the apparatus is located away from the pupil plane) in the radiation beam which changes as a function of spatial position in the radiation beam. For example, an embodiment of the invention may be capable of reducing or eliminating a field plane aberration in the radiation beam which varies with respect to spatial position at a rate which cannot be applied using actuators. For example, an embodiment of the invention may be capable of reducing or eliminating a phase ripple in the radiation beam. An embodiment of the invention may be capable of reducing or eliminating a localized field plane aberration in the radiation beam (i.e. a field plane aberration which is present in only part of the radiation beam when viewed in cross-section). It may not be possible to do this effectively using actuators.

Another wavefront modification apparatus comprises transmissive plates which are provided with a wire grid and a gas cooling apparatus. The wire grid may be used to modify the temperature of desired locations on the transmissive plates, and thereby modify an optical effect applied to a radiation beam by the transmissive plates. The plate and wire grid arrangement may allow modifications to be applied to the radiation beam with a higher spatial resolution than may be applied using actuators. A disadvantage of this plate and wire grid arrangement is that it may be relatively slow, since time is required in order for the transmissive plates to reach a desired temperature. A further disadvantage is that wires of the wire grid may block the radiation beam, and consequently cannot be provided in a field plane of the lithographic apparatus or close to a field plane (this would cause shadows formed by the wires to be imaged onto the substrate). One or more of these disadvantages may be overcome by an embodiment of the invention. As mentioned above, an embodiment of the invention may be capable of establishing a desired standing acoustic wave within around 0.3 ms. Since an embodiment of the invention does not use wires or other structures in the beam, it does not introduce shadows into the radiation beam and may therefore be used in a field plane of the lithographic apparatus. In addition, since wires or other structures are not used in the beam, an embodiment of the invention may not generate stray radiation through scattering of the radiation beam.

A further advantage of an embodiment of the invention is that gas cooling may not be required, thereby avoiding the relatively complex engineering to provide gas cooling. An additional advantage is that it may not be necessary to provide transmissive plates which are matched to the projection system of the lithographic apparatus. This is a substantial advantage, since matching transmissive plates to a projection system of a lithographic apparatus may be time consuming and expensive, and prevents those transmissive plates from being used in any other lithographic apparatus. An embodiment of the invention may be fitted to a lithographic apparatus without matching to the lithographic apparatus. This allows identical embodiments of the invention to be made and fitted to different lithographic or other apparatus.

A further advantage of an embodiment of the invention is that when the wavefront modification apparatus is switched off it does not apply any modification to the wavefront of the radiation beam (unlike the wire grid and plate apparatus).

The wavefront modification apparatus of an embodiment of the invention may be capable of applying a wavefront modification to the radiation beam sufficiently rapidly that the wavefront modification may vary during a scanning exposure of a pattern onto a substrate W (see FIG. 1). For example, a wavefront modification which changes during a scanning exposure may be applied to the radiation beam PB such that it compensates for the image distortion effect of patterning device heating during the scanning exposure by introducing aberration that counteracts this effect (or compensates for other unwanted effects). A scanning exposure may be performed by the lithographic apparatus in around 40 ms, and the image distortion caused by patterning device heating during the scanning exposure may be around 20 nm. This corresponds to a change of around 0.5 nm per ms. The wavelength modification apparatus is capable of establishing and/or modifying a standing acoustic wave within around 0.3 ms. Thus, the wavelength modification apparatus is fast enough to facilitate the correction of image distortion caused by patterning device heating during the scanning exposure.

The acoustic waves generated by the acoustic emitters may include components which propagate to a wall of the projection system or to other parts of the lithographic apparatus. However, the acoustic waves should decay reasonably quickly, and therefore may have a negligible negative effect upon the lithographic apparatus. If a significant negative effect is seen then absorbing material may be located at suitable locations in the lithographic apparatus to prevent or restrict propagation of the acoustic waves. For example, absorbing material may be located behind the acoustic emitters. Absorbing material may be provided in a ring which extends behind all of the acoustic emitters (or substantially all of the acoustic emitters).

An acoustic wave emitted by an acoustic emitter may have, for example, a thickness of around 1 cm (in this context the term "thickness" is intended to refer to the size of the acoustic wave transverse to its direction of propagation). A pair of acoustic waves having thicknesses of around 1 cm may be used to generate a standing acoustic wave having a thickness of around 1 cm. If the standing acoustic wave were to have an amplitude of 1 Pa then this would allow a 10 nm aberration compensation to be applied. In other words, the path length experienced by a portion of the radiation beam passing through a maximum pressure anti-node of the standing acoustic wave would be 10 nm longer than the path length experienced by a portion of the radiation beam passing through a node of the standing acoustic wave. It will be appreciated that a greater amplitude will apply a greater aberration effect to the radiation beam. Similarly, a thicker standing acoustic wave will apply a greater aberration effect to the radiation beam.

The thicknesses of standing acoustic waves generated by the wavefront modification apparatus may depend upon the configuration and/or size of the acoustic emitters and the wavelength of the acoustic wave. The thicknesses may be selected when producing the wavefront modification apparatus, according to the desired spatial resolution to be achieved. Thinner acoustic waves may need to be directed more accurately than thicker acoustic waves, in order to help ensure that they do not overlap with one another and/or that the overlap between them is controlled. Thicker acoustic waves may cause out of plane modifications to the radiation beam to occur, as is explained below.

In an embodiment in which the standing acoustic wave is provided in a desired plane of the lithographic apparatus (e.g. a pupil plane), it may be desirable to restrict the thickness of the standing acoustic wave such that it does not include a component outside of that plane which is sufficiently large to apply an undesired out of plane modification to the radiation beam. Restricting the thickness of the standing acoustic wave to be around 1 cm or less may be sufficient to avoid the standing acoustic wave applying undesired out of plane modifications to the radiation beam. For example, restricting the thickness of the standing acoustic wave to be around 1 cm may allow modifications of the radiation beam in the pupil plane to be applied without applying significant modifications outside of the pupil plane. The standing acoustic wave thickness of around 1 cm may apply at one or more locations in a projection system PS (this may depend upon the configuration of optical elements used in the projection system). Other standing acoustic wave thicknesses may apply. The maximum thickness of the standing acoustic wave that may be used at a pupil plane without introducing significant non-pupil plane effects will depend upon the configuration of the projection system, and in particular may depend upon the distance between pupil and field planes in the projection system. Similar considerations may apply when determining the maximum thickness of the standing acoustic wave that may be used at a field plane without introducing significant non-field plane effects.

As mentioned further above, the acoustic emitters of the wavefront modification apparatus may be controlled by a controller CT (see FIG. 1). The controller CT may be configured to monitor one or more measured wavefront aberrations of the radiation beam (e.g. measured using a sensor located in the substrate table WT). The controller CT may be configured to determine a standing acoustic wave configuration to be generated by the wavefront modification apparatus which will reduce or eliminate the measured wavefront aberration of the radiation beam. The controller CT may receive the measured wavefront aberration and determine where an additional phase should be added or subtracted from the wavefront to compensate for the aberration. The controller may then control the acoustic emitters to generate a pressure profile which will add or subtract the appropriate additional phase difference. For example, a defocus may be measured by a sensor in the substrate table WT. The controller may determine a standing acoustic wave configuration to be generated by the wavefront modification apparatus which will eliminate or reduce the defocus, and may then operate selected acoustic emitters such that they generate that standing acoustic wave configuration.

Instead of or in addition to being configured to monitor a measured wavefront aberration of the radiation beam, the controller CT may be configured to receive, generate, or retrieve from a memory, one or more predicted wavefront aberrations of the radiation beam. The prediction of a wavefront aberration may be based upon a wavefront aberration observed during calibration of the lithographic apparatus, and may be, for example, time-based (e.g., an aberration may occur due to an optical element of the lithographic apparatus heating up over time). The controller may be configured to determine a standing acoustic wave configuration to be generated by the wavefront modification apparatus which will reduce or eliminate the calculated or predicted wavefront aberration of the radiation beam.

The determination of the standing acoustic wave configuration used to reduce or eliminate a given wavefront aberration of the radiation beam may be performed, for example, by the controller referring to stored data. The stored data may for example comprise a lookup table (or data in some other format) which indicates standing acoustic wave configurations that will reduce or eliminate one or more wavefront aberrations. Interpolation between the acoustic wave configurations stored in the lookup table (or other data format) may be performed.

Aspects of the invention can be implemented in any convenient form. For example a computer program may be provided to carry out any of the methods described herein. Such a computer program may be carried on appropriate computer readable media which term includes any appropriate tangible storage device (e.g. a disc, ROM or RAM). Aspects of the invention can be implemented by way of an appropriately programmed computer. The computer and/or computer programs may be implemented, for example, in the controller CT.

The wavefront modification apparatus may be used to generate standing acoustic waves in air (or other gas) which is present in the lithographic apparatus. In an embodiment, the wavefront modification apparatus may be used to generate standing acoustic waves in water (or other liquid) which is present in the lithographic apparatus. For example, a standing acoustic wave may be generated in immersion liquid which is located between a projection system of the lithographic apparatus and a substrate during operation of the lithographic apparatus (as is used in immersion lithography). In an embodiment, the wavefront modification apparatus may be used to generate a standing acoustic wave in quartz (or some other solid) which is present in the lithographic apparatus. For example, a standing acoustic wave may be generated in an optical element (e.g., lens) of the lithographic apparatus.

A standing acoustic wave generated in a liquid or solid will modify the wavefront of the radiation beam in the same manner as a standing acoustic wave generated in the gas. However, the higher refractive index of the liquid or solid will mean that the maximum wavelength of the standing acoustic wave that may be generated for a given repetition rate of the radiation beam pulses is reduced. Since a liquid or solid allows a standing acoustic wave with reduced wavelength to be generated, they may be used for example when it is desired to generate a standing acoustic wave with a shorter wavelength (compared with a standing acoustic wave generated in gas).

In an embodiment, a pair of acoustic emitters of the wavefront modification apparatus may emit acoustic waves at different frequencies. Where this is the case, the acoustic wave that they generate together will not be stationary but will instead have a varying phase which depends upon the difference between the frequencies of the emitted acoustic waves. The acoustic wave will therefore travel towards one of the acoustic emitters. The acoustic wave may thus be described as a traveling acoustic wave rather than a standing acoustic wave. The controller CT may synchronize the traveling acoustic wave to the generation of radiation pulses by the source SO, such that the radiation pulses experience substantially the same pressure profile when they pass through the wavefront modification apparatus. The traveling acoustic wave may thus be used to modify the wavefront of the radiation beam PB in the same manner as is described above in relation to a standing acoustic wave.

In an embodiment, instead of or additionally to using a pair of acoustic emitters to generate a traveling acoustic wave, a single acoustic emitter may be used to generate the traveling acoustic wave. Where this is done an absorber may be provided opposite the acoustic emitter, the absorber acting to reduce or eliminate the reflection of the acoustic wave back towards the acoustic emitter. For example, a configuration which is similar to that shown in FIG. 3 may be used, with the reflectors 8a-c being replaced with absorbers. The absorbers may for example comprise an absorbent material, or may for example comprise an acoustic emitter which is not operating. The traveling acoustic wave may have an amplitude which decays as it moves away from the acoustic emitter. This may be advantageous for example when it is desired to apply a modification to the radiation beam which decays in amplitude across the radiation beam. The controller CT may synchronize the traveling acoustic wave to the generation of radiation pulses by the source SO, such that the radiation pulses experience substantially the same pressure profile when they pass through the wavefront modification apparatus.

The acoustic emitters described herein may be conventional acoustic emitters which are capable of emitting collimated or substantially collimated acoustic waves (for example electromagnetic acoustic transducers may be used).

In an embodiment, there is provided a wavefront modification apparatus comprising a plurality of acoustic emitters, the acoustic emitters configured to emit acoustic waves which travel at least partially across a radiation beam conduit.

In an embodiment, the acoustic emitters are configured to establish a standing acoustic wave which extends at least partially across the radiation beam conduit. In an embodiment, the acoustic emitters are provided in pairs, acoustic emitters of each pair facing towards one another. In an embodiment, a first acoustic emitter of a pair of acoustic emitters is configured to emit an acoustic wave having substantially the same frequency as an acoustic wave emitted by a second emitter of the pair of acoustic emitters. In an embodiment, the acoustic emitters are configured to substantially fill a cross-section of the radiation beam conduit with standing acoustic waves. In an embodiment, the wavefront modification apparatus further comprises a controller configured to control the frequency and phase of acoustic waves emitted by the acoustic emitters. In an embodiment, the controller is configured to switch on or switch off selected acoustic emitters in order to provide standing acoustic waves at desired locations in the radiation beam conduit. In an embodiment, the plurality of acoustic emitters are provided in substantially the same plane.

In an embodiment, there is provided a lithographic apparatus comprising: a support structure to support a patterning device, the patterning device serving provide a radiation beam with a pattern in its cross-section; a substrate table to hold a substrate; a projection system to project the patterned radiation beam onto a target portion of the substrate; and a wavefront modification apparatus according to any preceding claim.

In an embodiment, the acoustic emitters of the wavefront modification apparatus may be provided in the projection system and/or an illumination system of the lithographic apparatus, the illumination system configured to condition the beam of radiation and transport the beam toward the support structure. In an embodiment, the acoustic emitters lie in a pupil plane and/or a field plane of the lithographic apparatus. In an embodiment, the acoustic emitters lie in a plane which is substantially perpendicular to an optical axis of the lithographic apparatus. In an embodiment, the acoustic emitters are configured to emit acoustic waves having a frequency which corresponds with, or is a multiple of, a repetition rate of radiation pulses generated by a source of or associated with the lithographic apparatus. In an embodiment, the controller is configured to receive measurements or predictions of a wavefront aberration of the radiation beam, and to determine a standing acoustic wave configuration which will reduce or eliminate the wavefront aberration of the radiation beam.

In an embodiment, there is provided a device manufacturing method comprising: using a patterning device to provide a radiation beam with a pattern in its cross-section; using a projection system to project the patterned radiation beam onto a target portion of a substrate; and using acoustic emitters to emit acoustic waves to establish an acoustic wave which travels at least partially across a radiation beam conduit through which the radiation beam, patterned or not, passes prior to being incident upon the substrate.

In an embodiment, the method comprises using the acoustic emitters to establish a standing acoustic wave which extends at least partially across the radiation beam conduit. In an embodiment, the acoustic emitters are provided in pairs, acoustic emitters of each pair facing towards one another. In an embodiment, the method comprises substantially filling a cross-section of the radiation beam conduit with standing acoustic waves using the acoustic emitters. In an embodiment, the method comprises controlling the frequency and phase of acoustic waves emitted by the acoustic emitters. In an embodiment, the acoustic emitters lie in a pupil plane and/or a field plane of the patterned beam.

While specific embodiments of the invention have been described above, it will be appreciated that the invention may be practiced otherwise than as described. The description is not intended to limit the invention.

The invention claimed is:

1. An apparatus comprising:
   a plurality of acoustic emitters, the acoustic emitters configured to emit acoustic waves which travel at least partially across a radiation beam conduit to modify a wavefront of a radiation beam passing through the radiation beam conduit; and
   a control system configured to variably control at least two emitters of the plurality of acoustic emitters to adjust a phase of the acoustic waves from a first emitter of the at least two emitters to be different than a phase of the acoustic waves from a second emitter of the at least two emitters for a same time when the first emitter and the second emitter emit acoustic waves to the radiation beam conduit.

2. The apparatus of claim 1, wherein the acoustic emitters are configured to establish a standing acoustic wave which extends partially across the radiation beam conduit.

3. The apparatus of claim 1, wherein the acoustic emitters are provided in pairs, acoustic emitters of each pair facing towards one another and wherein a first acoustic emitter of a pair of acoustic emitters is configured to emit an acoustic wave having substantially the same frequency as an acoustic wave emitted by a second emitter of the pair of acoustic emitters.

4. The apparatus of claim 1, wherein the control system is further configured to control the frequency of acoustic waves emitted by the acoustic emitters.

5. The apparatus of claim 1, wherein the control system is further configured to switch on or switch off selected acoustic emitters in order to provide standing acoustic waves at desired locations in the radiation beam conduit.

6. The apparatus of claim 1, wherein the plurality of acoustic emitters are provided in substantially the same plane which is substantially perpendicular to an axis of the radiation beam conduit, the axis extending perpendicularly to the cross-section of the radiation beam conduit.

7. The apparatus of claim 1, wherein the control system is configured control at least two acoustic emitters of the plurality of acoustic emitters to emit acoustic waves at different frequencies, such that a traveling wave is established between them.

8. The apparatus of claim 1, wherein one or more of the acoustic emitters have an adjustable orientation and/or position.

9. The apparatus of claim 1, wherein a first acoustic emitter of the plurality of acoustic emitters faces towards a second acoustic emitter of the plurality of acoustic emitters, wherein the first acoustic emitter is spaced apart along an axis of the radiation beam conduit from the second acoustic emitter, the axis extending perpendicularly to the cross-section of the radiation beam conduit.

10. A lithographic apparatus comprising:
a substrate table to hold a substrate;
a projection system to project a patterned radiation beam onto a target portion of the substrate; and
a wavefront modification apparatus comprising a plurality of acoustic emitters, the acoustic emitters configured to emit acoustic waves which travel at least partially across a radiation beam conduit to modify a wavefront of a radiation beam passing through the radiation beam conduit, and a control system configured to variably control at least two emitters of the plurality of acoustic emitters to adjust a phase of the acoustic waves from a first emitter of the at least two emitters to be different than a phase of the acoustic waves from a second emitter of the at least two emitters for a same time when the first emitter and the second emitter emit acoustic waves to the radiation beam conduit.

11. The lithographic apparatus of claim 10, wherein the acoustic emitters lie in a plane which is substantially perpendicular to an optical axis of the lithographic apparatus.

12. The lithographic apparatus of claim 10, wherein the acoustic emitters are configured to emit acoustic waves having a frequency which corresponds with, or is a multiple of, a repetition rate of radiation pulses generated by a source of or associated with the lithographic apparatus.

13. The lithographic apparatus of claim 10, wherein the control system is further configured to control the frequency and phase of acoustic waves emitted by the acoustic emitters, to receive measurements or predictions of a wavefront aberration of the radiation beam, and to determine a standing acoustic wave configuration which will reduce or eliminate the wavefront aberration of the radiation beam.

14. The lithographic apparatus of claim 10, wherein the control system is further configured to switch on or switch off selected acoustic emitters in order to provide standing acoustic waves at desired locations in the radiation beam conduit.

15. The lithographic apparatus of claim 10, wherein a first acoustic emitter of the plurality of acoustic emitters faces towards a second acoustic emitter of the plurality of acoustic emitters, wherein the first acoustic emitter is spaced apart along an optical axis of the lithographic apparatus from the second acoustic emitter.

16. The lithographic apparatus of claim 10, wherein one or more of the acoustic emitters have an adjustable orientation and/or position.

17. A device manufacturing method comprising:
using a projection system to project a patterned radiation beam onto a target portion of a substrate;
using acoustic emitters to emit acoustic waves which travel at least partially across a radiation beam conduit through which the radiation beam, patterned or not, passes prior to being incident upon the substrate; and
variably controlling at least two emitters of the plurality of acoustic emitters to adjust a phase of the acoustic waves from a first emitter of the at least two emitters to be different than a phase of the acoustic waves from a second emitter of the at least two emitters for a same time when the first emitter and the second emitter emit acoustic waves to the radiation beam conduit.

18. The method of claim 17, comprising using the acoustic emitters to establish a standing acoustic wave which extends partially across the radiation beam conduit.

19. The method of claim 17, wherein the acoustic emitters are provided in pairs, acoustic emitters of each pair facing towards one another.

20. The method of claim 17, further comprising controlling at least two acoustic emitters of the plurality of acoustic emitters to emit acoustic waves at different frequencies, such that a traveling wave is established between them.

* * * * *